(12) United States Patent
Wang et al.

(10) Patent No.: US 12,449,455 B2
(45) Date of Patent: Oct. 21, 2025

(54) CIRCUIT FOR DETERMINING THE FREQUENCY OF A SIGNAL

(71) Applicant: Infineon Technologies AG, Neubiberg (DE)

(72) Inventors: Wei Wang, Munich (DE); Michael Augustin, Villach (AT); Jürgen Schäfer, Oberhaching (DE); Dietmar König, Munich (DE); Josef Niederl, Klagenfurt (AT); Shane O'Neill, Cork (IE)

(73) Assignee: Infineon Technologies AG, Neubiberg (DE)

( * ) Notice: Subject to any disclaimer, the term of this patent is extended or adjusted under 35 U.S.C. 154(b) by 201 days.

(21) Appl. No.: 18/493,866

(22) Filed: Oct. 25, 2023

(65) Prior Publication Data
US 2024/0142503 A1    May 2, 2024

(30) Foreign Application Priority Data

Oct. 26, 2022   (DE) .................... 10 2022 128 332.1
Aug. 8, 2023    (DE) .................... 10 2023 121 088.2

(51) Int. Cl.
*G01R 23/167*    (2006.01)

(52) U.S. Cl.
CPC ................. *G01R 23/167* (2013.01)

(58) Field of Classification Search
USPC ...................................... 324/76.44
See application file for complete search history.

(56) References Cited

U.S. PATENT DOCUMENTS

2018/0134544 A1 *   5/2018   Seshia ............... H03D 13/003

OTHER PUBLICATIONS

Xiaohui-Li et al. "Heterodyne Frequency Measurement Method Based on Virtual Instrument". Proc. of the 2007 IEEE International Frequency Control Symposium Joint with the 21st European Frequency and Time Forum, S. 220-222. Published Oct. 1, 2007.

* cited by examiner

*Primary Examiner* — Farhana A Hoque
(74) *Attorney, Agent, or Firm* — Eschweiler & Potashnik, LLC

(57) ABSTRACT

According to various embodiments, a circuit for determining the frequency of a signal is described, comprising an input configured to receive an analog input signal, an analog to digital converter configured to convert the analog input signal to a digital input signal, a digital mixer configured to generate a mixing result signal by mixing the digital input signal with a single bit binary signal having a reference frequency, a low pass filter configured to generate a filtered signal by filtering the mixing result signal, a measuring circuit configured to measure the period of the filtered signal and an output configured to output a value differing from the frequency of the single bit binary signal by the inverse of the measured period as the frequency to be determined.

20 Claims, 6 Drawing Sheets

CIRCUIT FOR DETERMINING THE FREQUENCY OF A SIGNAL

REFERENCE TO RELATED APPLICATIONS

This application claims priority to German Patent Application 10 2022 128 332.1, filed on Oct. 26, 2022 and German Patent Application 10 2023 121 088.2, filed on Aug. 8, 2023, the contents of which are hereby incorporated by reference in their entirety.

FIELD

The present disclosure relates to a circuit for determining the frequency of a signal.

BACKGROUND

In various applications of chips it is desirable to accurately determine the frequency of a signal. For example, for function safety, it may be required to periodically check whether a clock in the chip is correct. Another example is that the temperature dependency of the frequency of a signal generated by a crystal oscillator of a chip may be used to accurately determine the temperature of a chip provided it is possible to accurately determine the frequency of the signal generated by the crystal oscillator. Another application is checking the oscillator frequency for a communication interface which needs to be very accurate for certain communication protocols. Accordingly, approaches which allow accurate determination of the frequency of a signal are desirable.

SUMMARY

According to various embodiments, a circuit for determining the frequency of a signal is described, comprising an input configured to receive an analog input signal, an analog to digital converter configured to convert the analog input signal to a digital input signal, a digital mixer configured to generate a mixing result signal by mixing the digital input signal with a single bit binary signal having a reference frequency, a low pass filter configured to generate a filtered signal by filtering the mixing result signal, a measuring circuit configured to measure the period of the filtered signal and an output configured to output a value differing from the frequency of the single bit binary signal by the inverse of the measured period as the frequency to be determined.

BRIEF DESCRIPTION OF THE DRAWINGS

In the drawings, similar reference characters generally refer to the same parts throughout the different views. The drawings are not necessarily to scale, emphasis instead generally being placed upon illustrating the principles of the disclosure. In the following description, various aspects are described with reference to the following drawings, in which.

DETAILED DESCRIPTION

The following detailed description refers to the accompanying drawings that show, by way of illustration, specific details and aspects of this disclosure. Other aspects may be utilized and structural, logical, and electrical changes may be made without departing from the scope of the disclosure. The various aspects of this disclosure are not necessarily mutually exclusive, as some aspects of this disclosure can be combined with one or more other aspects of this disclosure to form new aspects.

Figure 1:
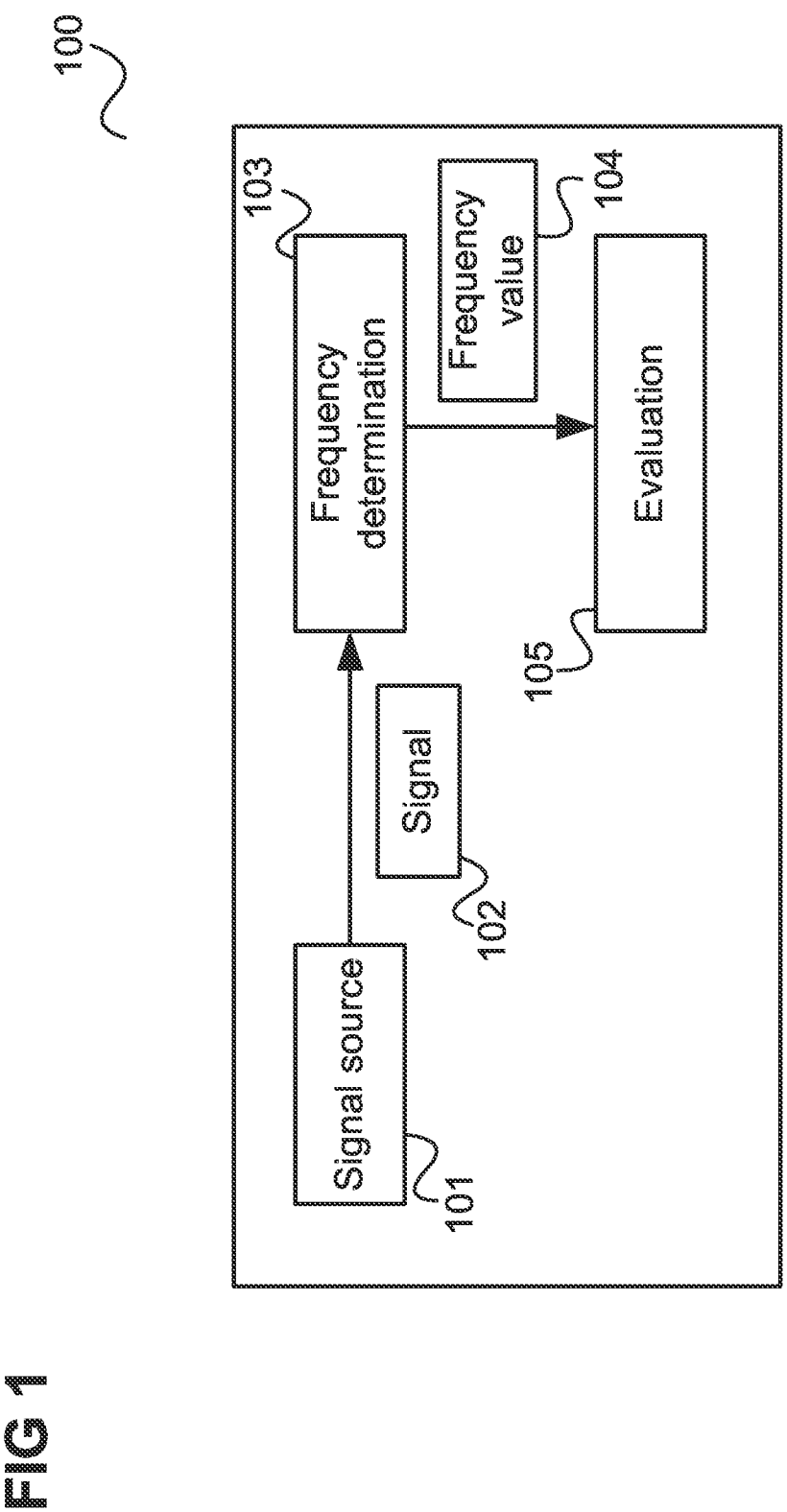
FIG. 1 shows chip as an example for an application of a frequency determination.

FIG. 1 shows chip 100 as an example for an application of a frequency determination.

The chip 100 comprises a source 101 of an analog signal 102 whose frequency should be determined. The signal source 101 may for example be a crystal oscillator whose frequency should be determined to measure the temperature of the chip (by making use of the fact that the frequency is temperature-dependent). Another example is that the signal source 101 is an oscillator which provides a timing signal for a communication interface which needs to have a certain frequency with high accuracy to avoid timing errors between the transmitter and the receiver.

Accordingly, the analog signal 102 is fed to a circuit 103 for determining the frequency of the signal 102. According to various embodiments, the circuit 103 outputs a digital value 104 indicating the determined frequency. The value 104 may then be evaluated by an evaluation circuit 105, e.g. a processing circuit which derives a temperature of the chip from the digital value 104 or a controller which controls the signal source 101 such that the frequency of the signal 102 is adjusted (e.g. to meet the frequency requirements of a communication interface).

Figure 2:
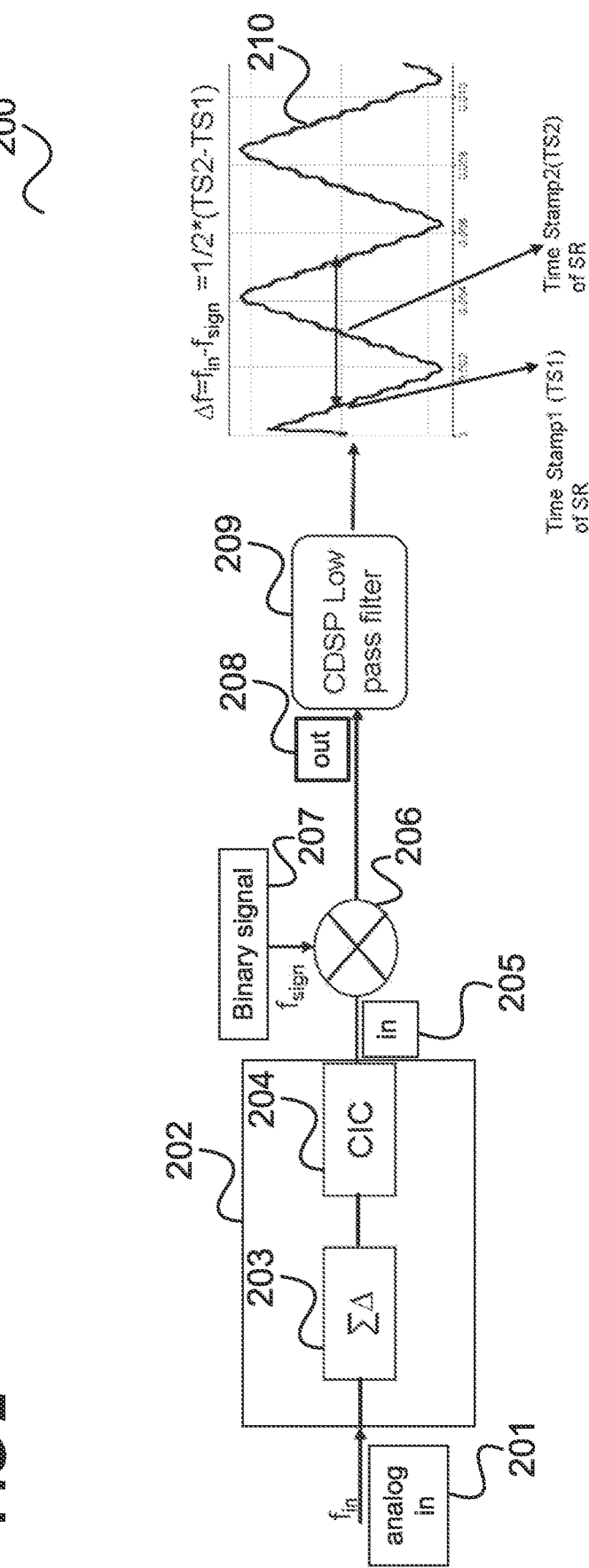
FIG. 2 shows a frequency determining circuit according to an embodiment which may be used as the circuit of the chip of FIG. 1.

FIG. 2 shows a frequency determining circuit 200 according to an embodiment which may be used as the circuit 103 of the chip of FIG. 1.

The frequency determining circuit 200 receives an analog input signal 201 (e.g. corresponding to the signal 102). The analog input signal 201 has a frequency $f_{in}$ which is the frequency to be determined.

The frequency determining circuit 200 comprises an analog to digital converter (ADC) 202, in this example a delta-sigma ADC (DSADC) comprising a Delta Sigma ($\Delta$-$\Sigma$) Analog-to-Digital conversion stage 203 (e.g. first order or second order) followed by a Cascaded Integrator Comb (CIC) filter 204. The analog input signal 201 is fed to the analog to digital converter (ADC) 202 whose output is a digital (input) signal 205 which is a digitized version of the analog input signal (e.g. a digital 16 bit signal, i.e. the various levels of the analog input signal 201 are represented as 16 bit values).

Figure 3:
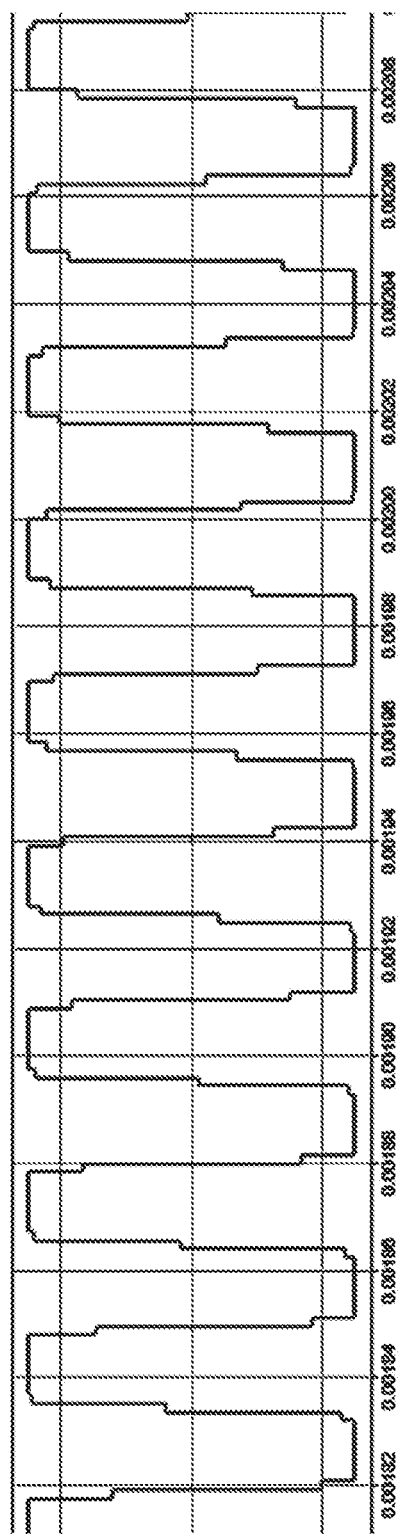
FIG. 3 shows an example of a digitized input signal.

FIG. 3 shows an example of a digitized input signal 300 generated by the ADC 202.

The digital signal 205 is then fed to a mixer 206 which mixes the digital signal 205 with a single bit binary signal 207 which switches form the value 0 to 1 (or from −1 to 1) and back with a frequency $f_{sign}$. The frequency $f_{sign}$ is predetermined and set similar to $f_{in}$ (i.e. what is expected for $f_{in}$, e.g. within 10%, within 5%, within 1% or even with 0.1% or 0.01%, e.g. depending on the desired sensitivity of the frequency determination). The single bit binary signal may for example be generated from a reference frequency (e.g. used for analog-to-digital conversion) by a frequency divider.

Figure 4:
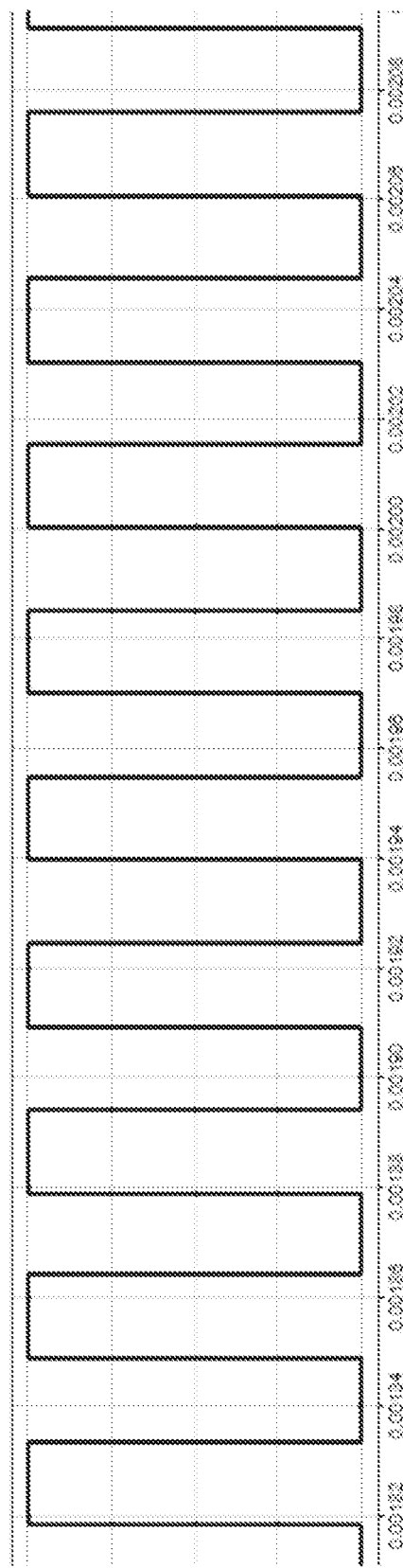
FIG. 4 shows an example of a single bit binary signal.

FIG. 4 shows an example of a single bit binary signal 400 (in this example switching between 0 and 1 and with a 6.25 ns resolution).

It should be noted that if the signal that is fed to the mixer 206 switches its sign like the single bit binary signal 207 the mixer 206 acts as a rectifier (when the single bit binary signal 207 switches between −1 and 1). So, a rectifier component is in this example used as a mixer for a frequency determination circuit. For example, when the frequency determining circuit 200 is provided in a vehicle, the same type of component as used for rectifying for motor control (e.g. for resolver support) may be used for the frequency determining circuit 200.

The mixing result signal 208, i.e. the output of the mixer 206 is fed to a low pass filter 209 (e.g. a low power filter realized by digital hardware or a digital signal processor).

Figure 5:
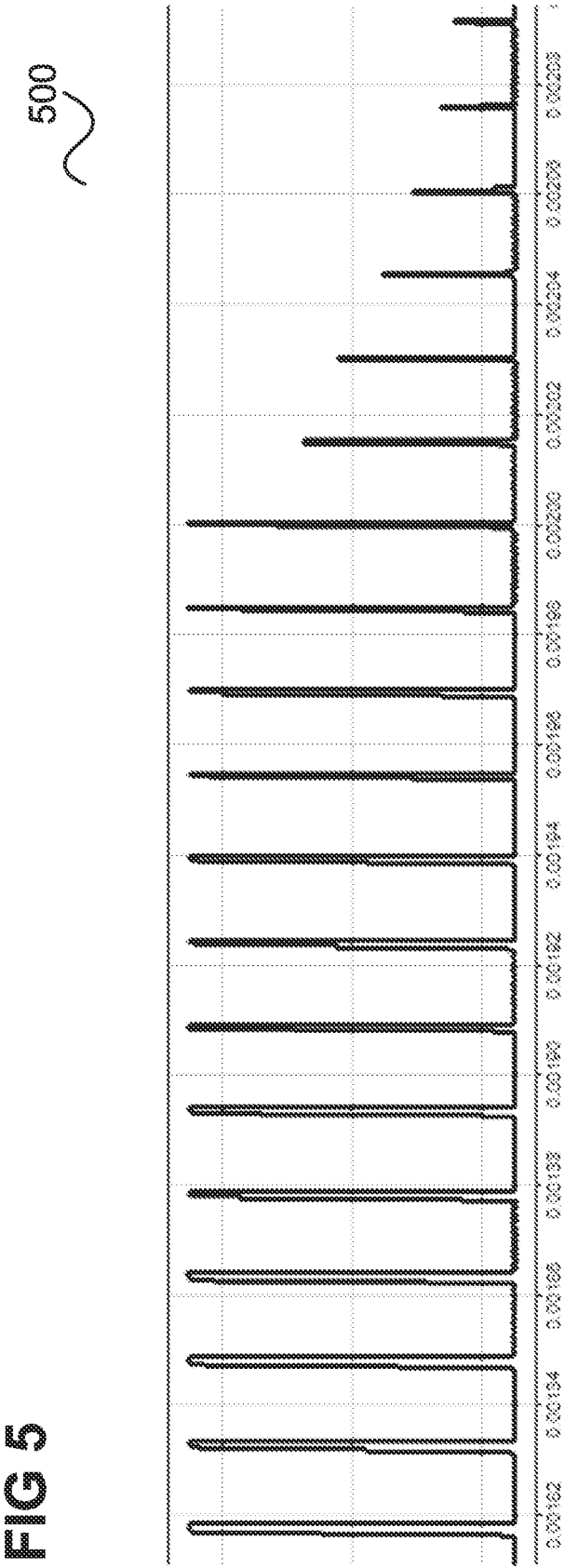
FIG. 5 illustrates a mixing result signal.

FIG. 5 illustrates a mixing result signal 500.

As the result of the mixing of a signal with frequency $f_{in}$ and a signal with frequency $f_{sign}$, the mixing result signal has a frequency component with frequency $f_{in}+f_{sign}$ and a frequency component with frequency $f_{in}-f_{sign}$.

The frequency $f_{sign}$ is chosen to be similar to $f_{in}$. Thus, according to the frequency component with frequency $f_{in}+f_{sign}$, the mixing result signal 500 has about double the number of peaks than the digitized input signal 300 and the single bit binary signal 400. Further, the mixing result signal 500 has a component with a relatively low frequency $f_{in}-f_{sign}$ which can be seen by the decreasing amplitude of the peaks (which increases again but the increase is not visible in the depicted portion of the mixing result signal 500). The low pass filter 209 filters out the high frequency component so the filter output signal 210 (see FIG. 2) is an envelope of the mixing result signal 500.

The filter output signal 210 has a frequency of $f_{in}-f_{sign}$. Therefore, by measuring the time between two zero crossings TS1, TS2 the frequency determining circuit 200 can determine the difference between the frequency of the input signal 201 and the frequency of the single bit binary signal 207 (which is known) by $\Delta f=f_{in}-f_{sign}=\frac{1}{2}*(TS2-TS1)$, i.e. the frequency determining circuit 200 measures the time between the two zero crossings TS1 and TS2 and outputs $f_{sign}+\frac{1}{2}*(TS2-TS1)$ as the value of $f_{in}$.

It should be noted that if $f_{sign}$ is smaller than $f_{in}$, then $f_{in}=f_{sign}+\frac{1}{2}*(TS2-TS1)$. However, is $f_{in}$ is smaller than $f_{sign}$, then it $f_{in}=f_{sign}-\frac{1}{2}*(TS2-TS1)$. However, for applications like a clock monitor it is not important whether to output $f_{sign}+\frac{1}{2}*(TS2-TS1)$ or $f_{sign}-\frac{1}{2}*(TS2-TS1)$ because both may be used to check whether the frequency of the input signal 201 is within e.g. +/−1% range of a nominal frequency. So, either of $f_{sign}+\frac{1}{2}*(TS2-TS1)$ or $f_{sign}-\frac{1}{2}*(TS2-TS1)$ may be output according to various embodiments. For an application like temperature sensing, a single bit binary signal can be provided by suitable selection of a frequency divider ratio for generating it such that it has a frequency which is sure to be smaller than $f_{in}$. Then $f_{in}=f_{sign}+\frac{1}{2}*(TS2-TS1)$ may be output (or, alternatively, $f_{sign}$ is set to be higher than $f_{in}$ and $f_{in}=f_{sign}-\frac{1}{2}*(TS2-TS1)$ is output).

It should be noted that measuring TS2−TS1 and calculating $\frac{1}{2}*(TS2-TS1)$ corresponds to measuring the period of the filter output signal 210.

In the following, example values for $f_{in}$, $f_{sign}$, the output period (i.e. the period of the filter output signal 210) and the sensitivity (i.e. the ratio of an error in the measurement of the output period to the error in the determined frequency) are given.

$f_{in}$=32.768 kHz, $f_{sign}$=33.768 kHz=>output period=1 ms, sensitivity=3.28 us/0.1%

$f_{in}$=32.768 kHz, $f_{sign}$=32.868 kHz=>output period=10 ms, sensitivity=328 ns/ppm, $f_{in}$=32.768 kHz, $f_{sign}$=32.778 kHz=>output period=100 ms, sensitivity=32.8 us/ppm (allows checking 1 ppm deviation)

$f_{in}$=8.192 kHz, $f_{sign}$=8.192.1 Hz or 8.1916 Hz=>output period=2.5 s, sensitivity=12 ms/ppm.

The frequency determining circuit 200 may be used to determine the frequency of multiple signal sources 101. For example, a multiplexer may be arranged at the input of the frequency determining circuit 200 for the analog input signal 201 such that it may forward any signals whose frequencies should be monitored (e.g. in a round robin scheme) such as a real-time clock signal, a communication bus timing signal (e.g. of CAN (controller area network) or LIN (local interconnect network) bus), a carrier signal (e.g. for NFC (near field communication)), an Ethernet clock etc. Further, for example at least some of the inputs of the multiplexer, a clock divider may be provided to reduce the respective frequency to be determined, e.g. such that all frequencies that are forwarded by the multiplexer are similar to $f_{sign}$. Alternatively, $f_{sign}$ (i.e. the reference frequency) may be changed depending on the expected frequency of the forwarded signal.

Figure 6:
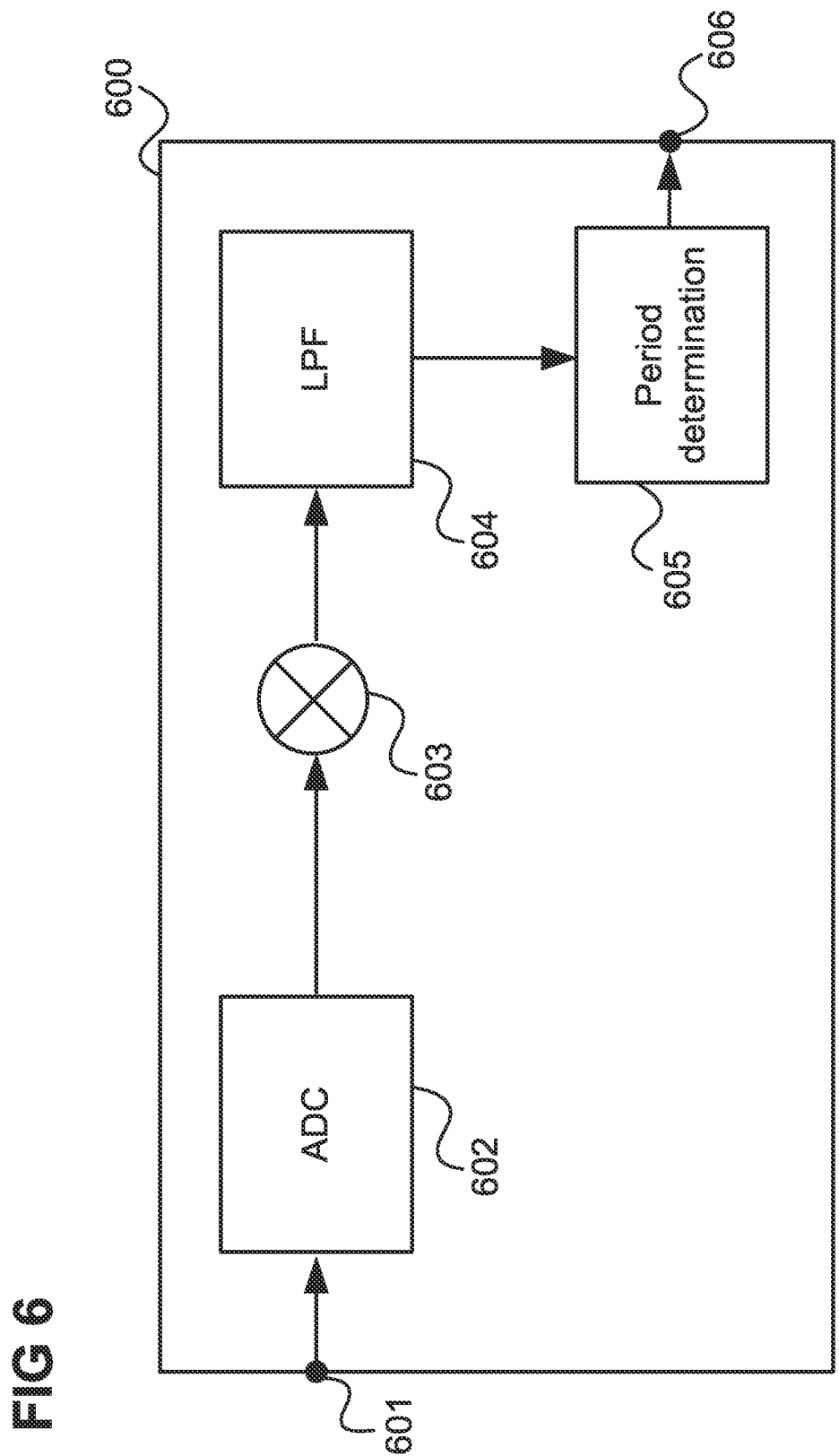
FIG. 6 shows a circuit for determining the frequency of a signal according to an embodiment.

In summary, according to various embodiments, a circuit is provided as illustrated in FIG. 6.

FIG. 6 shows a circuit 600 for determining the frequency of a signal according to an embodiment.

The circuit 600 comprises an input 601 configured to receive an analog input signal and an analog to digital converter 602 configured to convert the analog input signal to a digital input signal.

Further, the circuit 600 comprises a digital mixer 603 configured to generate a mixing result signal by mixing the digital input signal with a single bit binary signal having a reference frequency (i.e. switching from one binary state to the other and back with the reference frequency) and a low pass filter 604 configured to generate a filtered signal by filtering the mixing result signal.

The circuit 600 further comprises a measuring circuit 605 configured to measure the period of the filtered signal and an output 606 configured to output a value differing from the frequency of the single bit binary signal by the inverse of the measured period as the frequency to be determined.

According to various embodiments, in other words, a signal whose frequency is to be determined is mixed with a single bit binary signal, i.e. using a component which may for example be used for rectifying an input signal, as it is for example provided for resolver support.

Various Examples are described in the following:

Example 1 is a circuit for determining the frequency of a signal as described above with reference to FIG. 6.

Example 2 is the circuit of Example 1, wherein the analog to digital converter comprises a sigma delta analog to digital converter.

Example 3 is the circuit of Example 2, wherein the analog to digital converter comprises a cascaded integrator comb filter configured to generate the digital input signal from an output of the sigma delta analog to digital converter.

Example 4 is the circuit of any one of Examples 1 to 3, wherein the digital input signal is a 16 bit or 32 bit digital signal.

Example 5 is the circuit of any one of Examples 1 to 4, wherein the measuring circuit is configured to measure the period of the filtered signal by doubling the time between two zero crossings of the filtered signal.

Example 6 is the circuit of any one of Examples 1 to 5, wherein the single bit binary signal is a signal alternating between 0 and 1 or is a signal alternating between −1 and 1.

Example 7 is the circuit of any one of Examples 1 to 6, wherein the low-pass filter is configured to filter out a component of the mixing result signal having the sum of the reference frequency and the frequency of the digital input signal when the frequency of the digital input signal differs from the reference frequency by less than 10 percent.

Example 8 is the circuit of Example any one of Examples 1 to 7, comprising a signal generation circuit configured to generate the single bit binary signal with the reference frequency.

Example 9 is the circuit of any one of Examples 1 to 8, comprising a multiplexer configured to forward signals to be monitored sequentially to the input.

Example 10 is the circuit of any one of Examples 1 to 9, comprising a clock divider configured to generate the analog input signal from a signal to be monitored by dividing its frequency.

Example 11 is a method for determining the frequency of a signal comprising supplying the signal to the input of the circuit of any one of Examples 1 to 10, wherein the reference frequency is set within a predetermined range of an expected frequency of the signal.

Example 12 is the method of Example 11, comprising determining the range depending on a predetermined desired sensitivity of the determination of the frequency.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A circuit for determining a frequency of a signal, comprising:
   an input configured to receive an analog input signal;
   an analog to digital converter configured to convert the analog input signal to a digital input signal;
   a digital mixer configured to generate a mixing result signal by mixing the digital input signal with a single bit binary signal having a reference frequency;
   a low pass filter configured to generate a filtered signal by filtering the mixing result signal;
   a measuring circuit configured to measure a period of the filtered signal; and
   an output configured to output a value of the frequency of the signal, wherein the frequency of the signal differs from the frequency of the single bit binary signal by a frequency offset determined by an inverse of the measured period.

2. The circuit of claim 1, wherein the analog to digital converter comprises a sigma delta analog to digital converter.

3. The circuit of claim 2, wherein the analog to digital converter comprises a cascaded integrator comb filter configured to generate the digital input signal from an output of the sigma delta analog to digital converter.

4. The circuit of claim 1, wherein the digital input signal is a 16 bit or 32 bit digital signal.

5. The circuit of claim 1, wherein the measuring circuit is configured to measure the period of the filtered signal by doubling a time between two zero crossings of the filtered signal.

6. The circuit of claim 1, wherein the single bit binary signal is a signal alternating between 0 and 1 or is a signal alternating between −1 and 1.

7. The circuit of claim 1, wherein the low pass filter is configured to filter out a component of the mixing result signal having a sum of the reference frequency and a frequency of the digital input signal when the frequency of the digital input signal differs from the reference frequency by less than 10 percent.

8. The circuit of claim 1, further comprising a signal generation circuit configured to generate the single bit binary signal with the reference frequency.

9. The circuit of claim 1, further comprising a multiplexer configured to forward signals to be monitored sequentially to the input.

10. The circuit of claim 1, further comprising a clock divider configured to generate the analog input signal from a signal to be monitored by dividing a frequency of the signal to be monitored.

11. A method for determining the frequency of the signal comprising supplying the signal to the input of the circuit of claim 1, wherein the reference frequency is set within a predetermined range of an expected frequency of the signal.

12. The method of claim 11, further comprising determining the range depending on a predetermined desired sensitivity of the determination of the frequency.

13. A circuit, comprising:
   an analog to digital converter having an input, and an output;
   a digital mixer having a first input, a second input, and an output, the first input of the digital mixer coupled to the output of the analog to digital converter;
   a low pass filter having an input and an output, the input of the low pass filter coupled to the output of the digital mixer; and
   a period determination circuit having an input and an output, the input of the period determination circuit coupled to the output of the low pass filter; and
   a binary signal generator having a single binary output, the single binary output coupled to the second input of the digital mixer.

14. The circuit of claim 13, wherein the binary signal generator is configured to provide a binary signal having a reference frequency at the single binary output.

15. The circuit of claim 14, wherein the binary signal generator is configured to generate the binary signal based on a frequency division of a reference frequency signal.

16. The circuit of claim 13, wherein the analog to digital converter includes a sigma delta analog to digital converter having an input and an output, the input of the sigma delta analog to digital converter coupled to the input of the analog to digital converter.

17. The circuit of claim 16, wherein the analog to digital converter further includes a cascaded integrator comb filter having an input and an output, the input of the cascaded integrator comb filter coupled to the output of the sigma delta analog to digital converter, and the output of the cascaded integrator comb filter coupled to the output of the analog to digital converter.

18. A circuit, comprising:
   a digital mixer having a first input, a second input, and an output;

a low pass filter having an input and an output, the input of the low pass filter coupled to the output of the digital mixer; and a measuring circuit having an input and an output, the input of the measuring circuit coupled to the output of the low pass filter;

wherein the measuring circuit is configured to measure a period of a signal received on the input of the measuring circuit, and output a frequency value based on the measured period and a reference frequency.

19. The circuit of claim 18, wherein the digital mixer is configured to receive a binary signal having the reference frequency on the second input of the digital mixer.

20. The circuit of claim 18, further comprising an analog to digital converter having an input, and an output coupled to the first input of the digital mixer, wherein the frequency value is associated with a signal received on the input of the analog to digital converter.

* * * * *